US 6,686,610 B2

(12) United States Patent
Sheu

(10) Patent No.: US 6,686,610 B2
(45) Date of Patent: Feb. 3, 2004

(54) LIGHT EMITTING DIODE

(75) Inventor: Jinn-Kong Sheu, Tainan (TW)

(73) Assignee: South Epitaxy Corporation, Tainan (TW)

( * ) Notice: Subject to any disclaimer, the term of this patent is extended or adjusted under 35 U.S.C. 154(b) by 0 days.

(21) Appl. No.: 10/063,053

(22) Filed: Mar. 15, 2002

(65) Prior Publication Data
US 2003/0122147 A1 Jul. 3, 2003

(30) Foreign Application Priority Data
Dec. 27, 2001 (TW) .......................... 90132481 A

(51) Int. Cl.⁷ .......................... H01L 29/06; H01L 33/00
(52) U.S. Cl. .......................... 257/103; 257/13; 257/14; 257/23; 257/25; 257/96; 257/82; 257/102; 257/99
(58) Field of Search .......................... 257/82, 184, 18, 257/22, 103, 79, 102, 99, 98, 94, 92, 13, 14, 23, 25, 96

(56) References Cited
U.S. PATENT DOCUMENTS
6,515,306 B2 * 2/2003 Kuo et al. .................. 257/82

OTHER PUBLICATIONS

Sheu et al. "Low–operation voltage of InGaN/GaN light-–emitting diodes with Si–Doped In0.3Ga0.7/GaN short–period Supperlattice tunneling contact layer" entire document.*

"Low–Operation Voltage of InGaN/GaN Light–Emitting Diodes With Si–Doped In0.3 Ga0.7 N/GaN Short–Period Superlattice Tunneling Contact Layer" J.K. Sheu, J.M. Tsai, S.C. Shei, W.C. Lai, T.C. Wen, C.H. Kou, Y.K. Su, S.J. Chang, and G.C. Chi/IEEE Electron Device Letters, vol. 22, No. 10, Oct. 2001.

* cited by examiner

Primary Examiner—Minh Loan Tran
Assistant Examiner—Tan Tran
(74) Attorney, Agent, or Firm—Jiang Chyun IP Offfice

(57) ABSTRACT

A light emitting diode structure is formed on a substrate. A nucleation layer at low temperature is formed on the substrate. A buffer layer is formed on the nucleation layer for easing the subsequent formation of crystal growth. N active layer is disposed between an upper confinement layer and a lower confinement layer. The active layer include the semiconductor material doped with III-N elements. A contact layer is disposed on the upper confinement layer. A reversed tunneling layer is form on the contact layer, wherein the conductive types for both are different. A transparent layer is formed on the reversed tunneling layer. A cathode electrode contacts with the conductive buffer layer and is separated from the active layer and the transparent electrode.

18 Claims, 3 Drawing Sheets

LIGHT EMITTING DIODE

CROSS REFERENCE TO RELATED APPLICATIONS

This application claims the priority benefit of Taiwan application serial no. 90132481, filed Dec. 27, 2001.

BACKGROUND OF INVENTION

1. Field of Invention

The present invention relates to technology of light emitting device. Particularly, the present invention relates to a structure of light emitting diode using nitride-base III-N group compound. More particularly, the present invention relates to a structure having a reversed tunneling layer (RTL).

2. Description of Related Art

In recent years, gallium nitride-based III-N group compound semiconductor device, such as GaN, GaAlN, and GaInN, has been greatly taken as a light emitting device. FIG. 1 is a cross-sectional view, schematically illustrating structure of a conventional light emitting diode made of III-N group compound.

The light emitting diode is formed on a substrate 10, such as an $Al_2O_3$ substrate. A nucleation layer 12 and an N-type conductive buffer layer 14 are sequentially formed over the substrate 10. The buffer layer 14 includes GaN doped with N-type dopant, so as to ease the crystal growth for the subsequent crystal growing process. There is a light-emitting active layer 18 over the buffer layer 14. Usually, the active layer 18 is confined by a confinement layer, that is also, cladding layers 16, 20. The confinement layers 16, 20 are doped with opposite conductive type. For example, if the lower confinement layer 16 is the GaN layer doped with N-type dopants, the upper confinement layer 20 is the GaN layer doped with P-type dopants. Then, a contact layer 22 is formed on the upper confinement layer 20. The contact layer 22 is a P-type GaN layer. A transparent electrode layer 24 is formed on the contact layer 22. In addition, an electrode layer 26, serving as a cathode of the diode, is formed over the buffer layer 14 at the separated region from the confinement layers 16, 20 and the active layer 18.

In the above structure, the contact layer 22 is GaN layer doped with P-type dopants, where the dopants includes group II elements, such as Mg, Zn, Cd, Be. The dopants in GaN has a quite large activation energy. As a result, it is difficult to have high hole concentration in the contact layer 22. In addition, the P-type dopantsproduce carrier of holes, which have larger effective mass than that of electrons, causing a poor penetrability for the carrier. This also causes a poor ohm contact between the P-type contact layer 22 and the anode layer 24.

FIG. 2 is a cross-sectional view, schematically illustrating a light emitting region for the light emitting diode in FIG. 1. In FIG. 2, when the electrodes 24, 26 are applied with a forward bias, the diode is conducted. At this situation, current can flow from the electrode 24 to the active layer 18. In the conventional manner, the P-type contact layer 22 of GaN cannot have high carrier concentration and has large contact resistance between layer 22 and electrode 24. This results in a poor quality of current spreading. The p-type electrode layer 24 also only covers a portion of the contact layer 22. As shown in FIG. 2, the area having current flow is about the width L of the electrode layer 24. This limits the light emitting area for the diode. The function of the active layer cannot be fully performed. The light emitting efficiency of the diode is then greatly reduced.

In summary, the conventional light emitting diode is restricted by the physical properties of the contact layer. The P-type contact layer is difficult to grown with high hole concentration. This also causes the high fabrication cost and also causes low yield. Further still, the conventional structure cannot provide a diode with high light emitting efficiency. A large portion of the active layer 18 of the diode is not well utilized.

SUMMARY OF INVENTION

The invention provides a structure for a light emitting diode. The invention forms a reversed tunneling layer (RTL) with a high doping concentration on the contact later. The RTL associating with the transparent electrode can improve the light emitting efficiency of the product and reduce the operational voltage.

The invention provides a structure for a light emitting diode, which uses a reversed tunneling layer with high doping concentration on the contact layer, so as to improve the ohmic contact between the transparent electrode and the RTL.

As embodied and broadly described herein, a structure for a light emitting diode of the invention is as follow:

A structure for a light emitting diode includes a substrate. A nucleation layer and a buffer layer with a first conductive type are sequentially formed on the substrate. A confinement layer (lower confinement layer) with the first conductive type is disposed on the buffer layer. The confinement layer with the first conductive type and the conductive buffer layer have the same conductive type, such as P-type or N-type dopants. The active layer is located on the confinement layer to serve as the light emitting layer of the light emitting diode. A confinement layer (second confinement layer) with a second conductive type is disposed on the active layer. The confinement layer with the second conductive type and the confinement layer with the first conductive type have different conductive type. The contact layer with the second conductive type is located on the second confinement layer. The conductive types for the doped contact layer and the second confinement layer are the same. The reversed tunneling layer is located above the contact layer. The conductive types for the reversed tunneling layer and the contact layer are different. The transparent electrode is located above the reversed tunneling layer, and then an anode layer is formed. Another electrode, serving as a cathode layer, has a contact with the conductive buffer layer, and is separated from the upper/lower confinement layer, the active layer, the contact layer and the transparent electrode.

The foregoing dopants in the contact layer are P-type dopants as the conductive type. The N-type dopants for the reversed tunneling layer includes suitable N-type ions, such as $Si^+$, $P^+$, $As^+$, $Se^+$, $Te^+$, $S^+$, $O^+$, and so on.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The principle of the invention is mainly dealing with the contact layer for the light emitting diode using III-N group compound. An ion implantation technology is employed for transforming and then forming a reversed tunneling layer with a high electron concentration. This is helpful for the formation of the transparent electrode in the subsequent process and results in a good ohmic contact for the transparent electrode.

Figure 1:
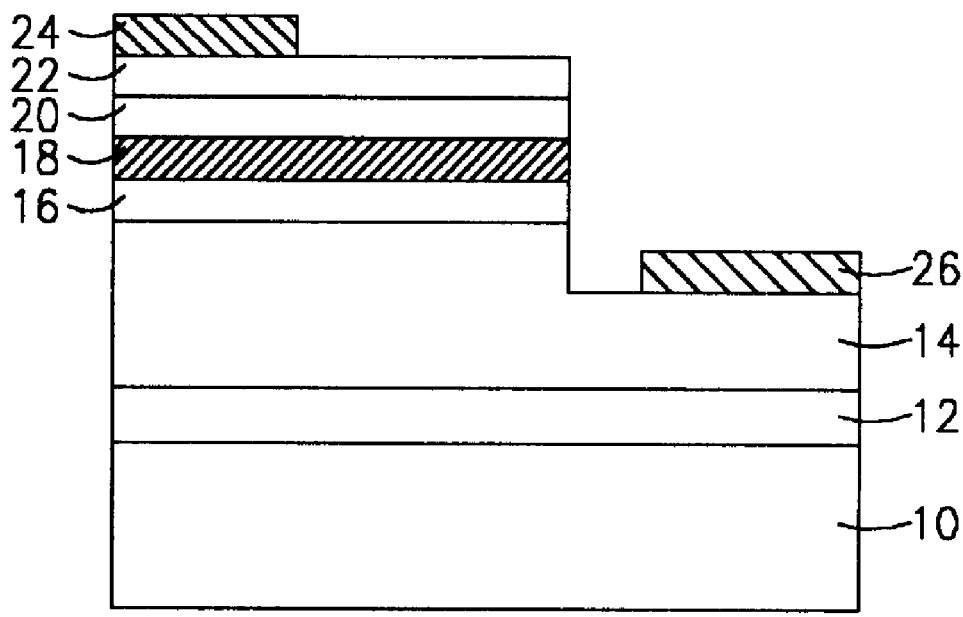
FIG. 1 is a cross-sectional view, schematically illustrating structure of a conventional light emitting diode made of III-N group compound.
Figure 2:
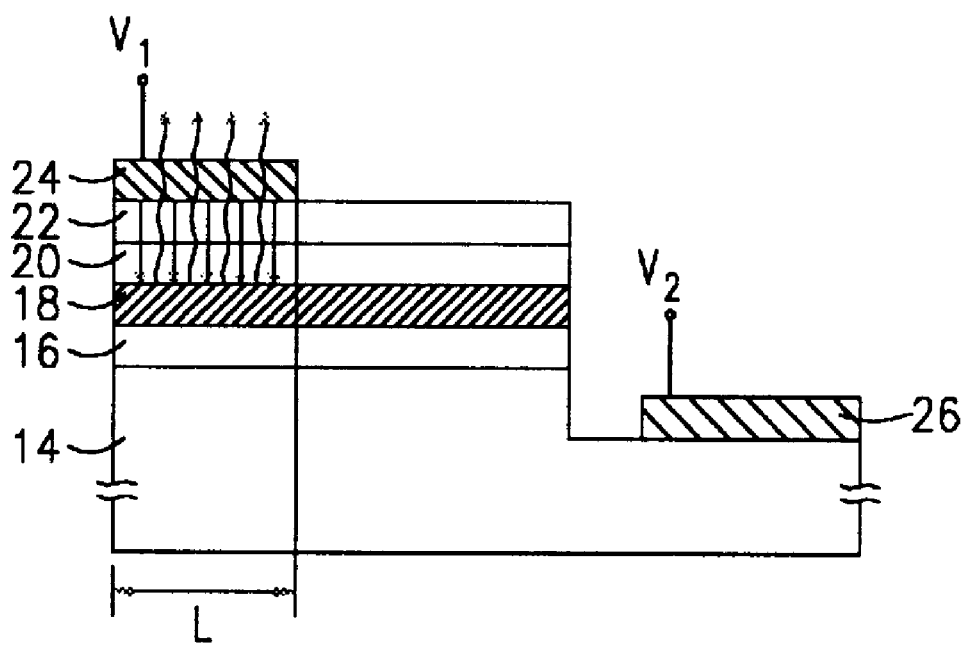
FIG. 2 is a cross-sectional views, schematically illustrating a light emitting region for the light emitting diode in FIG. 1.
Figure 3:
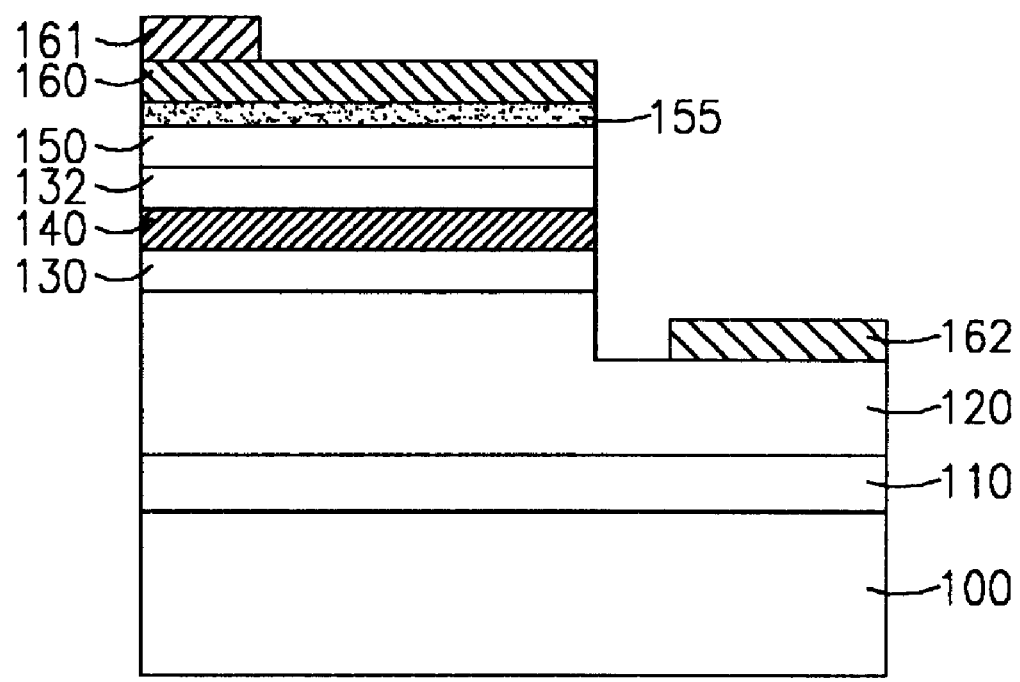
FIG. 3 is a cross-sectional view, schematically illustrating a structure of light emitting diode including III-N group compound, according to one preferred embodiment of this invention.

FIG. 3 is a cross-sectional view, schematically illustrating a structure of light emitting diode of this invention.

The structure of invention first includes a substrate 100. The substrate can be sapphire, SiC, ZnO, Si-substrate, GaP, GaAs, $Al_2O_3$, or any suitable substrate material. A nucleation layer 110 is formed over the substrate 100 with a material such as $Al_uIn_vGa_{1-u-v}N(u, v>/=0; 0</=u+v</=1)$.

A first-conductive-type buffer layer 120 is formed on the nucleation layer 110. The buffer layer 120 includes, for example, $Al_cIn_dGa_{1-c-d}N(c, d>/=0; 0</=c+d<1)$. Generally, it is difficult to directly form a gallium nitride-based epitaxial layer with P-type or N-type on the substrate. This is because the gallium nitride-based semiconductor has poor match of the crystal lattice with the substrate. Usually, a gallium nitride-based compound semiconductor to serve as the nucleation layer 110 and the buffer layer 120 are formed beforehand. In the example, the buffer layer 120 includes, for example, the N-type $Al_cIn_dGa_{1-c-d}N$, so as to improve quality of the crystal growth of gallium nitride-based compound in the subsequent process later, and also increases the production yield.

An electrode 162, serving as a cathode of the light emitting diode, is formed on the buffer layer 120, and is located at a region separated from a lower confinement layer 130, an upper confinement layer 132, and an active layer 140. The electrode layer 162 can include, for example, Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au, or any similar material, all of which have good ohmic contact with the conductive buffer layer, and therefore have smaller contact resistance.

The lower confinement layer 130 is formed on the buffer layer 120, and includes gallium nitride-based compound semiconductor, such as N-type $Al_xIn_yGa_{1-x-y}N$ (x, y>/=0; 0</=x+y<1; x>c, where c is the Al content for the buffer layer 120). Dopants for N-type can be chosen by skilled artisans, and are not described here.

An active layer 140 is formed on the lower confinement layer 130. The active layer is a light emitting layer. The active layer includes, for example, the indium gallium nitride based multiple quantum well. In this example, the active layer 140 can be either doped or undoped $Al_aIn_bGa_{1-a-b}N/Al_cIn_dGa_{1-c-d}N$(a, b>/=0; 0</=a+b<1; c, d>/=0; 0</=c+d<1; c>a, where c is the index for the buffer layer 120) with a quantum well structure. The doping conductive type can be N-type or P-type. The dopants used to form the N-type doping or the P-type doping are well known by skilled artisans.

An upper confinement layer 132 is formed on the active layer 140. The upper confinement layer 132 can include gallium nitride-based compound semiconductors, such as P-type doped $Al_xIn_yGa_{1-x-y}N(x, y>/=0; 0</=x+y<1; x>c)$. The P-type dopants can be selected from the conventional material known by skilled artisans. The active layer 140 with either N-type or P-type is confined by the lower confinement layer 130 and the upper confinement layer 132. In the foregoing, materials of the gallium nitride-based compound semiconductor, content weight, dopant type, and so on can vary according to the actual design. The above embodiment is only an example for description.

Then, a contact layer 150 is formed over the upper confinement layer 132. The contact layer 150 includes the material of III-N group compound, such as a P-type doped material of $Al_uIn_vGa_{1-u-v}N(u, v>/=0; 0</=u+v<1)$.

After the contact layer 150 is formed, an ion implantation process is performed to converting the contact layer into a reversed tunneling layer 155. In this embodiment, the ion implantation process is used to implant N-type dopants into the P-type contact layer 150, so as to convert it into the reversed tunneling layer 155, which is helpful for the subsequent formation of the transparent layer 160. The N-type dopants are, for example, any suitable N-type ions, such as $Si^+$, $P^+$, $As^+$, $Se^+$, $Te^+$, $S^+$, $O^+$, and so on. In order to avoid that the carriers cannot directly penetrate the reversed tunneling layer 155, the thickness should not be too thick. The thickness preferably has an upper limitation of about 10 nm. This is to prevent the rectified junction from occurring and further affecting the operation of the light emitting diode.

Then, a transparent electrode 160 is formed on the reversed tunneling layer 155 with a thickness preferably not greater than 0.1 microns. The transparent electrode 160 can be formed by semiconductor fabrication process with metal or transparent conductive materials. The transparent electrode includes, for example, The transparent electrode can include a metal layer of Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$, and so on. The transparent electrode can also include, for example, N-type transparent conductive oxide layer (TCO), such as ITO, CTO, ZnO:Al, $ZnGa_2O_4$, $SnO_2$:Sb, $Ga_2O_3$:Sn, $AgInO_2$:Sn, $In_2O_3$:Zn, and so on or P-type TCO, such as $CuAlO_2$, LaCuOS, NiO, $CuGaO_2$, $SrCu_2O_2$, and so on.

An electrode 161 can also be formed on the transparent electrode 160 to serve as an anode of the light emitting diode. The electrode 161 can include, for example, Ti/Au, Ti/Al/Pt/Au, Cr/Al/Pt/Au, Cr/Al/Ti/Au, Pd/Al/Ti/Au, Pd/Al/Pt/Au, Nd/Al/Pt/Au, Nd/Al/Ti/Au, NiAl/Ti/Au, NiAl/Pt/Au, NiAl/Cr/Au, and so on.

According to the conventional manner, the contact layer contacts with the transparent electrode that is formed subsequently, the carrier concentration for the contact layer usually needs a rather high level, such as $1\times10^{18}/cm^3$ or higher, so as to obtain a low-resistivity electrode. However, it is very difficult to grow a P-type contact layer with the carrier concentration level of $1\times10^{18}/cm^3$ or higher for the P-type gallium nitride-based compound, such as p-(AlIn)GaN. In the conventional semiconductor fabrication technologies, if the carrier concentration in the semiconductor material is too low, it would have a large contact resistance with the metal electrode. It is even more severe for the P-type semiconductor material.

Since the P-type doped GaN layer usually is doped with the group II elements of, for example, Mg, Zn, Cd, or Be. These kinds of dopants in the GaN have quite large activation energy. It is very difficult to obtain a P-type contact layer with high dopant concentration. On the contrary, the semiconductor material doped with N-type dopant, such as Si, can have a quite high electron concentration, wherein the activation energy is rather low. The holes, producing from P-type dopants, have larger effective mass than that of the electrons, so that the carriers with respect to the P-type dopants has more poor penetrability (penetration probability) than the carriers with respect to the N-type dopants. As a result, the P-type contact layer 22 has poor ohmic contact with the transparent electrode.

Figure 4:
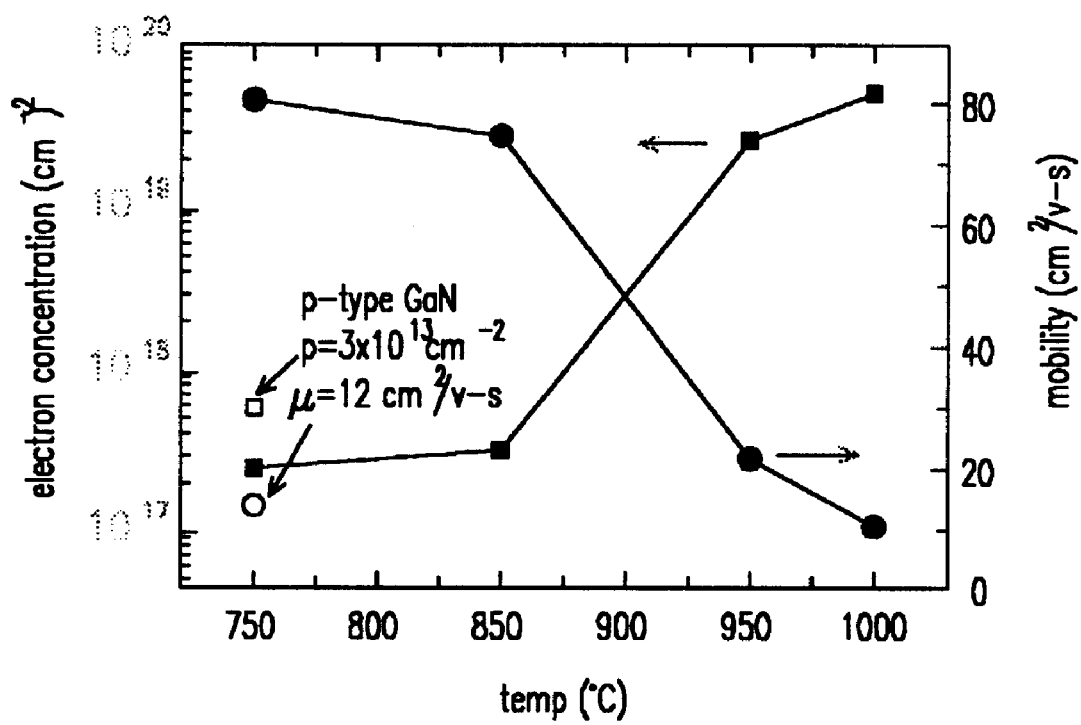
FIG. 4 is a drawing, illustrating a relation of the electron concentration and mobility varying with the annealing temperature after the silicon ion implantation on the p-GaN, according to the preferred embodiment of this invention.

Therefore, as shown in FIG. 3, the present invention uses the ion implantation technology to implant the N-type dopant into the P-type contact layer 150, so as to convert it into a reversed tunneling layer 155 as an N-type with high electron concentrations. In this manner, the N-type reversed tunneling layer 155 has very low resistivity due to the smaller activation energy for the N-type dopants. Taking Si as an example, the activation energy is about 10 20 meV, also and Mg is about 150 200 meV. The electrons has larger penetrability, and therefore the transparent electrode and the N-type reversed tunneling layer 155 can have the better characteristics of ohmic contact. After the P-type GaN contact layer is implanted with N-type dopants and is also annealed, some portion of the P-type contact layer can be converted into the N-type reversed tunneling layer with high electron concentration. As show in FIG. 4, after the original P-type GaN is implanted with ions of $^{28}Si^+$, it is annealed under various temperatures for converting into N-type GaN. By this manner, the P-type GaN with electron-hole concentration of about $3\times10^{17}/cm^3$ can be easily to be converted into prossessing the electron concentration of greater than $1\times10^{19}/cm^3$. Since the portion of P-type contact layer with a thickness less than 10 nm becomes a N-type doped layer by the foregoing manner. The light emitting diode has a $n^+p$ junction at the upper portion and a pn junction at the lower portion, whereby a back series connection structure is formed. When a bias is applied on them, since a breakdown for the $n^+p$ junction easily occurs, the injected carriers can directly penetrate through without affecting the operation of the pn junction. This means that the light emitting diode can be operated as usual without improper function.

Furthermore, since the low-resistivity reversed tunneling layer 155 is formed on the contact layer 150, the reversed tunneling layer 155 and the transparent layer 160 have better ohmic contact. Also and the area of the transparent electrode can be easily formed to have the same area as the reversed tunneling layer 155. The structure of the present invention can increase the current flowing through the area between the active layer 140 and the transparent electrode 160. Therefore, when the anode 161 and the cathode of the diode are applied with a forward bias, all of the light generated by the whole active layer 140 can transmit through the transparent electrode for use. This means that the light emitting area for the structure of the invention is larger the active area of the conventional structure. The present invention includes the reversed tunneling layer associating with the transparent electrode, whereby the light emitting efficiency for the diode can be effectively improved.

In addition, the transparent electrode 160 and the reversed tunneling layer 155 have the same dopant type, and therefore a junction does not occur. Comparing with the conventional skill, the conventional skill form the transparent electrode directly on the contact layer, which usually is a P-type GaN in III-N compound semiconductor material, while the transparent electrode usually is a N-type material, such as ITO or CTO. The transparent electrode and the contact layer are in different conductive type, and a P-N junction occurs at the interface. This affects the operation for the device, and it is more sever when the carrier concentration is not sufficiently high.

In summary, the light emitting diode of the invention, comparing with the conventional light emitting diode, has several advantages as follows:

The light emitting diode of the invention forms the reversed tunneling layer with high dopant concentration on the contact layer. By the additional effect from the transparent electrode, it can improve the light emitting efficiency and reduce the operation voltage.

The light emitting diode of the invention forms the reversed tunneling layer with high dopant concentration on the contact layer, so that the transparent electrode can have better ohmic contact.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure for a light emitting diode, comprising:

a substrate;

a nucleation layer disposed over the substrate;

a conductive buffer layer disposed over the nucleation layer;

a first confinement layer disposed over the conductive buffer layer, wherein a conductive type of the first confinement layer is the same as a conductive type of the conductive buffer layer;

an active layer disposed over the first confinement layer, wherein the active layer includes a semiconductor material from III-N elements;

a second confinement layer disposed over the active layer, wherein a conductive type of the second confinement layer is different from the conductive type of the first confinement layer;

a contact layer disposed over the second confinement layer, wherein a conductive type of the contact layer is the same as the conductive type of the second confinement layer;

a reversed tunneling layer disposed over the contact layer, wherein a conductive type of the reversed tunneling layer is different from the conductive type of the contact layer;

a transparent electrode disposed over the reversed tunneling layer;

an anode disposed over the transparent electrode; and a cathode having contact with the conductive buffer layer, and separated from the first and the second confinement layers, the active layer, the contact layer and the transparent electrode.

2. The structure of claim 1, wherein the transparent electrode includes metal.

3. The structure of claim 1, wherein the substrate includes sapphire, SiC, ZnO, Si, GaP, or GaAs.

4. The structure of claim 1, wherein the contact layer is doped with P-type dopants.

5. The structure of claim 1, wherein the reversed tunneling layer is doped with N-type ions including one selected from the group consisting of $Si^+$, $P^+$, $As^+$, $Se^+$, $Te^+$, $S^+$, and $O^+$.

6. The structure of claim 1, wherein the active layer includes a quantum well structure from elements of III-N group.

7. The structure of claim 6, wherein the quantum well structure is formed from III-N compound including $Al_aIn_bGa_{1-a-b}N/Al_xIn_yGa_{1-x-y}N$ (a, b$>$/=0; 0$<$/=a+b$<$1; x, y$>$/=0; 0$<$/=x+y$<$1; x$>$a).

8. The structure of claim 1, wherein the cathode includes one selected from the group consisting of Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, and Ti/NiAl/Cr/Au.

9. The structure of claim 1, wherein the transparent electrode include metal or metal laminate and a thickness of the transparent electrode is less than 0.1 microns.

10. The structure of claim 9, wherein the transparent electrode includes a transparent conductive oxide (TCO), which comprises one selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

11. The structure of claim 1, wherein the transparent electrode includes one selected from the group consisting of Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$, N-type transparent conductive oxide layer (TCO), ITO, CTO, ZnO:Al, $ZnGa_2O_4$, $SnO_2$:Sb, $Ga_2O_3$:Sn, $AgInO_2$:Sn, $In_2O_3$:Zn, P-type TCO, $CuAlO_2$, LaCuOS, NiO, $CuGaO_2$, and $SrCu_2O_2$.

12. A light emitting diode structure, comprising:

a substrate;

a conductive buffer layer disposed over the substrate;

an active structured layer disposed over the substrate, the active structured layer comprising a semiconductor material from III-N elements;

a contact layer disposed over the active structured layer;

a reversed tunneling layer disposed over the contact layer, wherein a conductive type of the reversed tunneling layer is different from a conductive type of the contact layer;

a transparent electrode disposed over the reversed tunneling layer; and a cathode having contact with the conductive buffer layer, and isolated from the active structured layer and the transparent electrode.

13. The light emitting diode structure of claim 12, wherein the contact layer is doped with P-type dopants.

14. The light emitting diode structure of claim 12, wherein the reversed tunneling layer is doped with N-type ions including one selected from the group consisting of $Si^+$, $P^+$, $As^+$, $Se^+$, $Te^+$, $S^+$, and $O^+$.

15. The light emitting diode structure of claim 12, wherein the transparent electrode includes one selected from the group consisting of Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$, N-type transparent conductive oxide layer (TCO), ITO, CTO, ZnO:Al, $ZnGa_2O_4$, $SnO_2$:Sb, $Ga_2O_3$:Sn, $AgInO_2$:Sn, $In_2O_3$:Zn, P-type TCO, $CuAlO_2$, LaCuOS, NiO, $CuGaO_2$, and $SrCu_2O_2$.

16. The light emitting diode structure of claim 12, wherein the active structured layer comprises:

a first confinement layer disposed over the conductive buffer layer, wherein a conductive type of the first confinement layer is the same as a conductive type of the conductive buffer layer;

an active layer disposed over the first confinement layer, wherein the active layer includes a semiconductor material from III-N elements; and a second confinement layer disposed over the active layer, wherein a conductive type of the second confinement layer is different from the conductive type of the first confinement layer.

17. The light emitting diode structure of claim 12, further comprising a nucleation layer disposed between the substrate and the conductive buffer layer.

18. The light emitting diode structure of claim 12, wherein the substrate includes sapphire, SiC, ZnO, Si, GaP, or GaAs.

* * * * *